(12) United States Patent
Wheeler et al.

(10) Patent No.: US 7,107,201 B2
(45) Date of Patent: Sep. 12, 2006

(54) SIMULATING A LOGIC DESIGN

(75) Inventors: William R. Wheeler, Southborough, MA (US); Matthew J. Adiletta, Worcester, MA (US)

(73) Assignee: Intel Corporation, Santa Clara, CA (US)

( * ) Notice: Subject to any disclaimer, the term of this patent is extended or adjusted under 35 U.S.C. 154(b) by 679 days.

(21) Appl. No.: 09/941,952

(22) Filed: Aug. 29, 2001

(65) Prior Publication Data

US 2003/0046052 A1 Mar. 6, 2003

(51) Int. Cl.
*G06F 17/50* (2006.01)
*G06F 9/455* (2006.01)
*G06F 9/44* (2006.01)

(52) U.S. Cl. .............................. 703/15; 703/22; 716/3; 716/11; 716/18; 717/107

(58) Field of Classification Search ................... 703/15, 703/14; 716/1, 2, 11, 12, 18
See application file for complete search history.

(56) References Cited

U.S. PATENT DOCUMENTS

| | | | |
|---|---|---|---|
| 4,703,435 A | 10/1987 | Darringer et al. | |
| 4,970,664 A | 11/1990 | Kaiser et al. | |
| 5,128,871 A | 7/1992 | Schmitz | |
| 5,212,650 A | 5/1993 | Hooper et al. | |
| 5,220,512 A | 6/1993 | Watkins et al. | |
| 5,258,919 A | 11/1993 | Yamanouchi et al. | |
| 5,267,175 A | 11/1993 | Hooper | |
| 5,278,769 A | 1/1994 | Bair et al. | |
| 5,287,289 A | 2/1994 | Kageyama et al. | |
| 5,297,053 A | 3/1994 | Pease et al. | |
| 5,301,318 A | 4/1994 | Mittal | |
| 5,371,851 A | 12/1994 | Pieper et al. | ................ 345/501 |
| 5,384,710 A | 1/1995 | Lam et al. | |
| 5,475,605 A | 12/1995 | Lin | |
| 5,493,507 A | 2/1996 | Shinde et al. | |
| 5,506,788 A | 4/1996 | Cheng et al. | |
| 5,513,119 A | 4/1996 | Moore et al. | |
| 5,544,067 A | 8/1996 | Rostoker et al. | |
| 5,553,002 A | 9/1996 | Dangelo et al. | |
| 5,568,397 A | 10/1996 | Yamashita et al. | |
| 5,598,347 A | 1/1997 | Iwasaki | |
| 5,603,015 A | 2/1997 | Kurosawa et al. | |
| 5,604,894 A | 2/1997 | Pickens et al. | |
| 5,629,857 A | 5/1997 | Brennan | |

(Continued)

FOREIGN PATENT DOCUMENTS

EP 0 404 482 12/1990

(Continued)

OTHER PUBLICATIONS

Jeffery et al., M. Monte Carlo Optimization of Superconducting Complementary Output Swithching Logic Circuits, IEEE Transactions on Applied Superconductivity, vol. 6, No. 3, Sep. 1998, pp. 104-119.*

(Continued)

*Primary Examiner*—Russell Frejd
(74) *Attorney, Agent, or Firm*—Fish & Richardson P.C.

(57) ABSTRACT

Simulating a logic design having combinatorial logic and state logic includes representing the combinatorial logic and the state logic using separate graphic elements, identifying clock domains for the combinatorial logic and the state logic using the separate graphic elements, generating computer code that simulates operation of portions of the logic design, the computer code being generated based on the clock domains, and associating the computer code with graphic elements that correspond to the portions of the logic design.

27 Claims, 7 Drawing Sheets

U.S. PATENT DOCUMENTS

| | | | |
|---|---|---|---|
| 5,650,947 A * | 7/1997 | Okumura | 703/16 |
| 5,663,662 A | 9/1997 | Kurosawa | |
| 5,666,289 A | 9/1997 | Watkins | |
| 5,673,198 A | 9/1997 | Lawman et al. | |
| 5,685,006 A | 11/1997 | Shiraishi | |
| 5,694,579 A | 12/1997 | Razdan et al. | |
| 5,706,476 A | 1/1998 | Giramma | |
| 5,717,928 A | 2/1998 | Campmas et al. | |
| 5,724,250 A | 3/1998 | Kerzman et al. | |
| 5,757,655 A | 5/1998 | Shih et al. | |
| 5,809,283 A | 9/1998 | Vaidyanathan et al. | |
| 5,828,581 A | 10/1998 | Matumura | |
| 5,831,869 A | 11/1998 | Ellis et al. | |
| 5,841,663 A | 11/1998 | Sharma et al. | |
| 5,852,564 A | 12/1998 | King et al. | |
| 5,889,677 A | 3/1999 | Yasuda et al. | |
| 5,892,678 A | 4/1999 | Tokunoh et al. | |
| 5,892,682 A | 4/1999 | Hasley et al. | |
| 5,903,469 A | 5/1999 | Ho | |
| 5,911,061 A * | 6/1999 | Tochio et al. | 703/23 |
| 5,933,356 A | 8/1999 | Rostoker et al. | |
| 5,937,190 A | 8/1999 | Gregory et al. | |
| 5,963,724 A | 10/1999 | Mantooth et al. | |
| 5,974,242 A | 10/1999 | Damarla et al. | |
| 6,044,211 A | 3/2000 | Jain | |
| 6,053,947 A | 4/2000 | Parson | |
| 6,066,179 A | 5/2000 | Allan | |
| 6,077,304 A | 6/2000 | Kasuya | |
| 6,106,568 A | 8/2000 | Beausang et al. | |
| 6,117,183 A | 9/2000 | Teranishi et al. | |
| 6,120,549 A | 9/2000 | Goslin et al. | |
| 6,132,109 A | 10/2000 | Gregory et al. | |
| 6,135,647 A | 10/2000 | Balakrishnan et al. | |
| 6,152,612 A | 11/2000 | Liao et al. | |
| 6,161,211 A | 12/2000 | Southgate | |
| 6,178,541 B1 | 1/2001 | Joly et al. | |
| 6,205,573 B1 | 3/2001 | Hasegawa | |
| 6,208,954 B1 | 3/2001 | Houtchens | |
| 6,216,256 B1 | 4/2001 | Inoue et al. | |
| 6,219,822 B1 | 4/2001 | Gristede et al. | |
| 6,223,148 B1 * | 4/2001 | Stewart et al. | 703/25 |
| 6,226,780 B1 | 5/2001 | Bahra et al. | |
| 6,233,540 B1 | 5/2001 | Schaumont et al. | |
| 6,233,723 B1 | 5/2001 | Pribetich | |
| 6,234,658 B1 | 5/2001 | Houldsworth | |
| 6,236,956 B1 | 5/2001 | Mantooth et al. | |
| 6,260,179 B1 | 7/2001 | Ohsawa et al. | |
| 6,272,671 B1 | 8/2001 | Fakhry | |
| 6,275,973 B1 | 8/2001 | Wein | |
| 6,292,931 B1 | 9/2001 | Dupenloup | |
| 6,298,468 B1 | 10/2001 | Zhen | |
| 6,311,309 B1 | 10/2001 | Southgate | |
| 6,324,678 B1 | 11/2001 | Dangelo et al. | |
| 6,327,693 B1 | 12/2001 | Cheng et al. | |
| 6,353,806 B1 | 3/2002 | Gehlot | |
| 6,353,915 B1 | 3/2002 | Deal et al. | |
| 6,360,356 B1 | 3/2002 | Eng | |
| 6,366,874 B1 | 4/2002 | Lee et al. | |
| 6,378,115 B1 | 4/2002 | Sakurai | |
| 6,381,563 B1 | 4/2002 | O'Riordan et al. | |
| 6,381,565 B1 | 4/2002 | Nakamura | |
| 6,389,379 B1 * | 5/2002 | Lin et al. | 703/14 |
| 6,401,230 B1 | 6/2002 | Ahanessians et al. | |
| 6,421,816 B1 | 7/2002 | Ishikura | |
| 6,438,729 B1 | 8/2002 | Ho | |
| 6,438,731 B1 | 8/2002 | Segal | |
| 6,440,780 B1 | 8/2002 | Kimura et al. | |
| 6,449,762 B1 | 9/2002 | McElvain | |
| 6,457,164 B1 | 9/2002 | Hwang et al. | |
| 6,473,885 B1 | 10/2002 | Wallace | |
| 6,477,683 B1 | 11/2002 | Killian et al. | |
| 6,477,688 B1 | 11/2002 | Wallace | |
| 6,477,689 B1 | 11/2002 | Mandell et al. | |
| 6,480,985 B1 | 11/2002 | Reynolds et al. | |
| 6,487,698 B1 | 11/2002 | Andreev et al. | |
| 6,490,545 B1 | 12/2002 | Peng | |
| 6,505,328 B1 | 1/2003 | Van Ginneken et al. | |
| 6,505,341 B1 | 1/2003 | Harris et al. | |
| 6,516,456 B1 | 2/2003 | Garnett et al. | |
| 6,519,742 B1 | 2/2003 | Falk | |
| 6,519,755 B1 | 2/2003 | Anderson | |
| 6,523,156 B1 | 2/2003 | Cirit | |
| 6,539,536 B1 | 3/2003 | Singh et al. | |
| RE38,059 E | 4/2003 | Yano et al. | |
| 6,546,528 B1 | 4/2003 | Sasaki et al. | |
| 6,574,787 B1 | 6/2003 | Anderson | |
| 6,591,407 B1 | 7/2003 | Kaufman et al. | |
| 6,643,836 B1 * | 11/2003 | Wheeler et al. | 716/11 |
| 6,708,321 B1 * | 3/2004 | Wheeler et al. | 716/18 |
| 6,721,925 B1 * | 4/2004 | Wheeler et al. | 716/2 |
| 6,745,160 B1 * | 6/2004 | Ashar et al. | 703/14 |
| 2001/0018758 A1 | 8/2001 | Tanaka et al. | |
| 2002/0023256 A1 | 2/2002 | Seawright | |
| 2002/0038447 A1 | 3/2002 | Kim et al. | |
| 2002/0042904 A1 | 4/2002 | Ito et al. | |
| 2002/0046386 A1 | 4/2002 | Skoll et al. | |
| 2002/0049957 A1 | 4/2002 | Hosono et al. | |
| 2002/0059054 A1 | 5/2002 | Bade et al. | |
| 2002/0112221 A1 | 8/2002 | Ferreri et al. | |
| 2002/0138244 A1 | 9/2002 | Meyer | |
| 2002/0166100 A1 | 11/2002 | Meding | |
| 2003/0004699 A1 | 1/2003 | Choi et al. | |
| 2003/0005396 A1 | 1/2003 | Chen et al. | |
| 2003/0016206 A1 | 1/2003 | Taitel | |
| 2003/0016246 A1 | 1/2003 | Singh | |
| 2003/0036871 A1 | 2/2003 | Fuller et al. | |
| 2003/0046051 A1 * | 3/2003 | Wheeler et al. | 703/14 |
| 2003/0046053 A1 * | 3/2003 | Wheeler et al. | 703/15 |
| 2003/0046054 A1 * | 3/2003 | Wheeler et al. | 703/15 |
| 2003/0046640 A1 * | 3/2003 | Wheeler et al. | 716/1 |
| 2003/0046642 A1 * | 3/2003 | Wheeler et al. | 716/2 |
| 2003/0046648 A1 * | 3/2003 | Wheeler et al. | 716/11 |
| 2003/0046649 A1 * | 3/2003 | Wheeler et al. | 716/12 |
| 2003/0177455 A1 | 9/2003 | Kaufman et al. | |
| 2004/0143801 A1 | 7/2004 | Waters et al. | 716/3 |

FOREIGN PATENT DOCUMENTS

| | | |
|---|---|---|
| EP | 0 433 066 | 6/1991 |
| EP | 0 720 233 | 7/1996 |
| EP | 0 901 088 | 3/1999 |
| EP | 1 065 611 | 1/2001 |
| JP | 58-060559 | 4/1983 |
| JP | 03-225523 | 10/1991 |
| JP | 07-049890 | 2/1995 |
| JP | 08-314892 | 11/1996 |
| JP | 2001-068994 | 3/2001 |
| WO | WO 98/37475 | 8/1998 |
| WO | WO 98/55879 | 12/1998 |
| WO | WO 99/39268 | 8/1999 |
| WO | WO 00/65492 | 11/2000 |

OTHER PUBLICATIONS

Mitra et al., S. Design Diversity for Concurrent error Detection in Sequential Logic Circuits, 19th IEEE Proceedings on VLSI Test Symposium, May 2001, pp. 178-183.*

Gassenfeit, E. H., "Control System Design Realization via VHDL-A: Requirements", Proceedings of the 1996 IEEE International Symposium on Computer-Aided Control System Design, Sep 15, 1996, pp. 282-285.

Kutzschebauch, "Efficient logic optimization using regularity extraction", Proceedings of 2000 International Conference on Computer Design, Sep. 17, 2000, pp. 487-493.

Lahti, et al., "SADE: a Graphical Toll for VHDL-Based System Analysis", 1991 IEEE International Conference on Computer-Aided Design, Nov. 11, 1991, pp. 262-265.

Lin, et al., "A Goal Tree Based High-Level Test Planning System for DSP Real Number Models", 1998 Proceedings of International Test Conference, Oct. 18, 1998, pp. 1000-1009.

NB84035598, "Binary Relational Schema to Model Structured LSI Design", IBM Technical Disclosure Bulletin, vol. 26, No. 10B, Mar. 1984, pp. 5598-5601.

NN7807629, "Functional Oriented Symbolic Macromodeling Algorithm", IBM Technical Disclosure Bulletin, vol. 21, No. 2, Jul. 1978, pp. 629-631.

NN8006341, "Macro Physical-To-Logical Checking LSI Chip Design", IBM Technical Disclosure Bulletin, vol. 23, No. 1, Jun. 1980, pp. 341-345.

NN9407481, "Functional Modeling using object Collaboration Diagram", IBM Technical Disclosure Bulletin, vol. 37, No. 7, Jul. 1994, pp. 481-486.

Parlakbilek, et al., "A Multiple-Strength Multiple-Delay Compiled-Code Logic Simulator", *IEEE Transactions on Computer-Aided Design of Integrated Circuits and Systems*, 12(12):1937-1946 (1993).

Su, Stephen, "An Interactive Design Automation System", *Proceedings of the 10th Design Automation Workshop on Design Automation*, pp. 253-261, Jun. 1973.

Yli-Pietila, et al., "The Design and Simulation of Complex Multitechnology Systems", IEEE International Conference on Systems Engineering, Aug. 9, 1990, pp. 474-477.

Maxfield, C., "Digital Logic Simulation: Event-Driven, Cycle-Based, and Home-Brewed", *Electrical Design News*, 41(14):129-136 (1996).

Foley et al., "An Object Based Graphical User Interface for Power Systems", IEEE Transactions on Power Systems, vol. 8, No. 1, Feb. 1993, pp. 97-104.

Pedram et al., "Floorplanning with Pin assignment", 1990 IEEE International Conference on Computer-Aided Design, Nov. 11, 1990, pp. 98-101.

Renoir, HDL Design Datasheet, Mentor Graphics, 1-8, 1999.

Mentor Graphics Corporation, Renoir ™ With HDL2Graphics™, pp. 1-6, 1998, Oregon.

Mentor Graphics Corporation, Renoir HDL Design Datasheet, pp. 1-2, 1999, Oregon.

Computer Design, "After Hard Knocks, Cycle-Based Simulators Stand Their Ground". http://www.computer-design.com/Editorial/1996/10/ASIC/after.html, accessed on Aug. 23, 2001, pp. 1-5.

* cited by examiner

SIMULATING A LOGIC DESIGN

TECHNICAL FIELD

This invention relates to simulating a logic design comprised of combinatorial logic and state logic.

BACKGROUND

Logic designs for computer chips typically include combinatorial elements and state elements. Combinatorial elements, such as AND gates and OR gates, combine two or more logic states to produce an output. State elements, such as latches and flip-flops (FFs), hold a logic state for a period of time, usually until receipt of an external clock signal.

Computer languages exist which allow designers to simulate logic designs, including combinatorial and state elements, prior to forming the logic on silicon. Examples of such languages include Verilog and Very High-Level Design Language (VHDL). Using these languages, a designer can write code to simulate a logic design, then execute the code in order to determine if the logic design performs properly.

Standard computer languages may also be used to simulate a logic design.

DESCRIPTION

Figure 1:
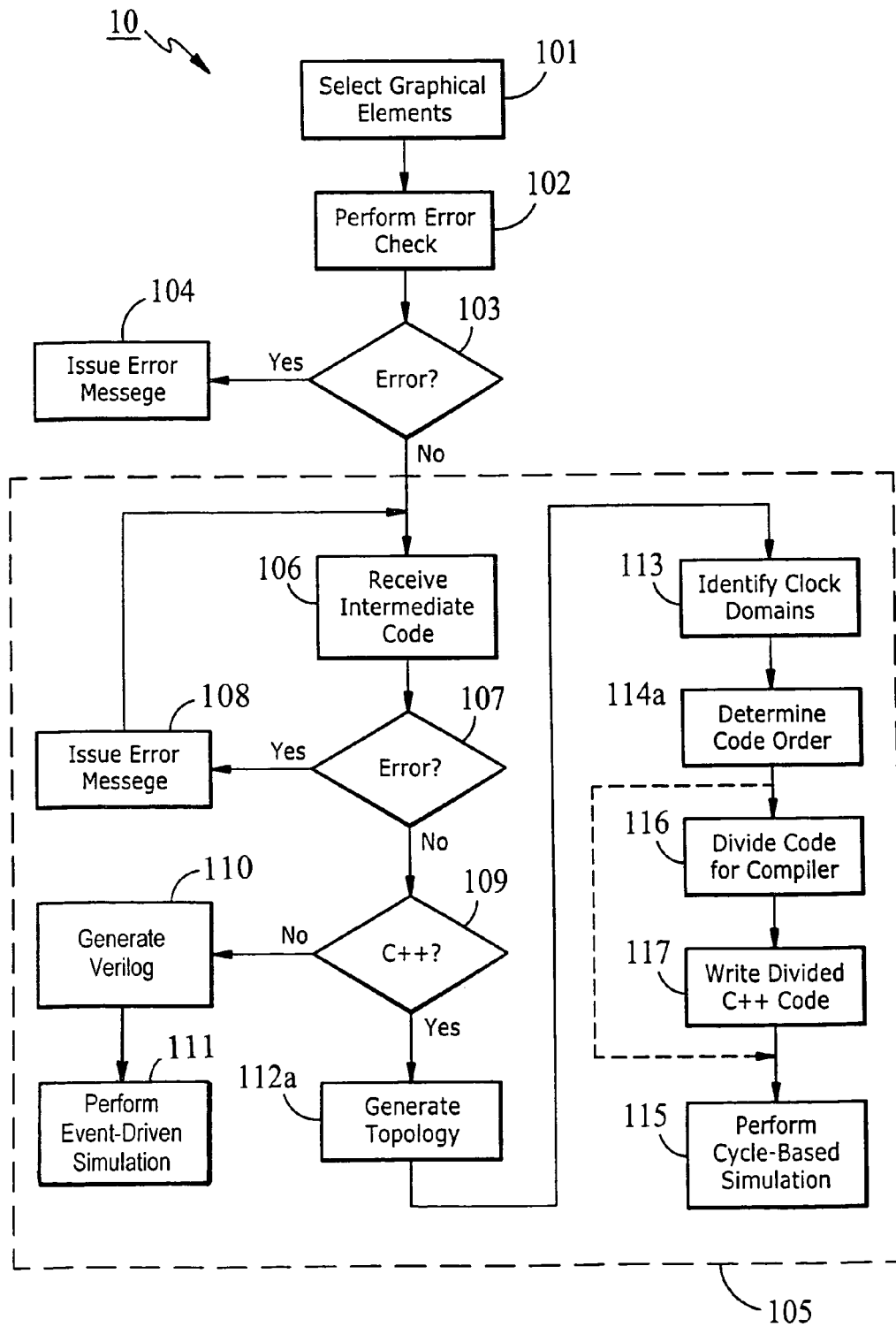
FIG. 1 is a flowchart showing a process for generating simulation code for a logic design.

Referring to FIG. 1, a process 10 is shown for simulating a logic design comprised of combinatorial logic and state logic. Process 10 may be implemented using a computer program running on a computer or other type of machine, as described in more detail below.

In operation, process 10 selects (101), in response to a logic designer's input, graphic elements to generate a block diagram representation of a logic design. The graphics elements are selected from a graphics library and may include combinatorial logic and state logic elements. Graphics elements in the library may be definable or may have predefined functions. For example, the library may contain software objects that perform the function of a flip flop (FF) or a latch. The library may also contain graphics elements that are undefined, i.e., that have no code associated with them.

Figure 2:
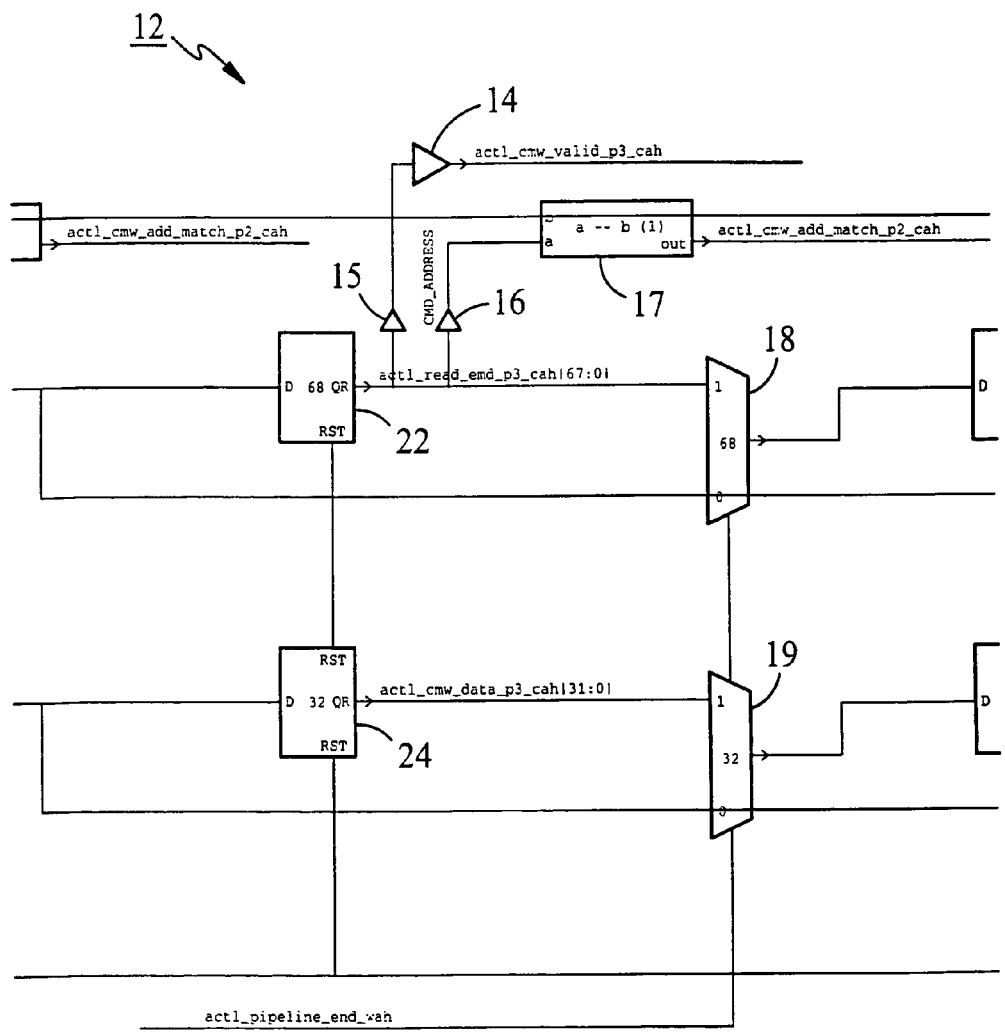
FIG. 2 is a block diagram of a logic design containing individual state and combinatorial elements.

Each block in the block diagram may represent individual elements or combinations of elements. For example, FIG. 2 shows a graphical representation of a logic design 12 containing combinatorial logic elements 14 to 19 and state logic elements 22 and 24. In logic design 12, each block represents a single combinatorial element (e.g., multiplexers 18 and 19) or state element (e.g., FFs 22 and 24). By contrast, in logic design 26 (FIG. 3), the functionality of several combinatorial elements is contained in a single combinatorial block 28 and the function of several state elements is contained in a single state block 30.

Once the graphical representation of the logic design has been completed (e.g., FIGS. 2 and 3), process 10 performs (102) an error check on the design to determine if there are determines if there are any unterminated or inconsistent connections in the design. If any such problems are detected (103), process 10 issues (104) an error message to the logic designer. The error message may specify the nature of the problem and its location within the logic design. The logic designer is then given the opportunity to correct the problem before process 10 moves forward.

Figure 3:
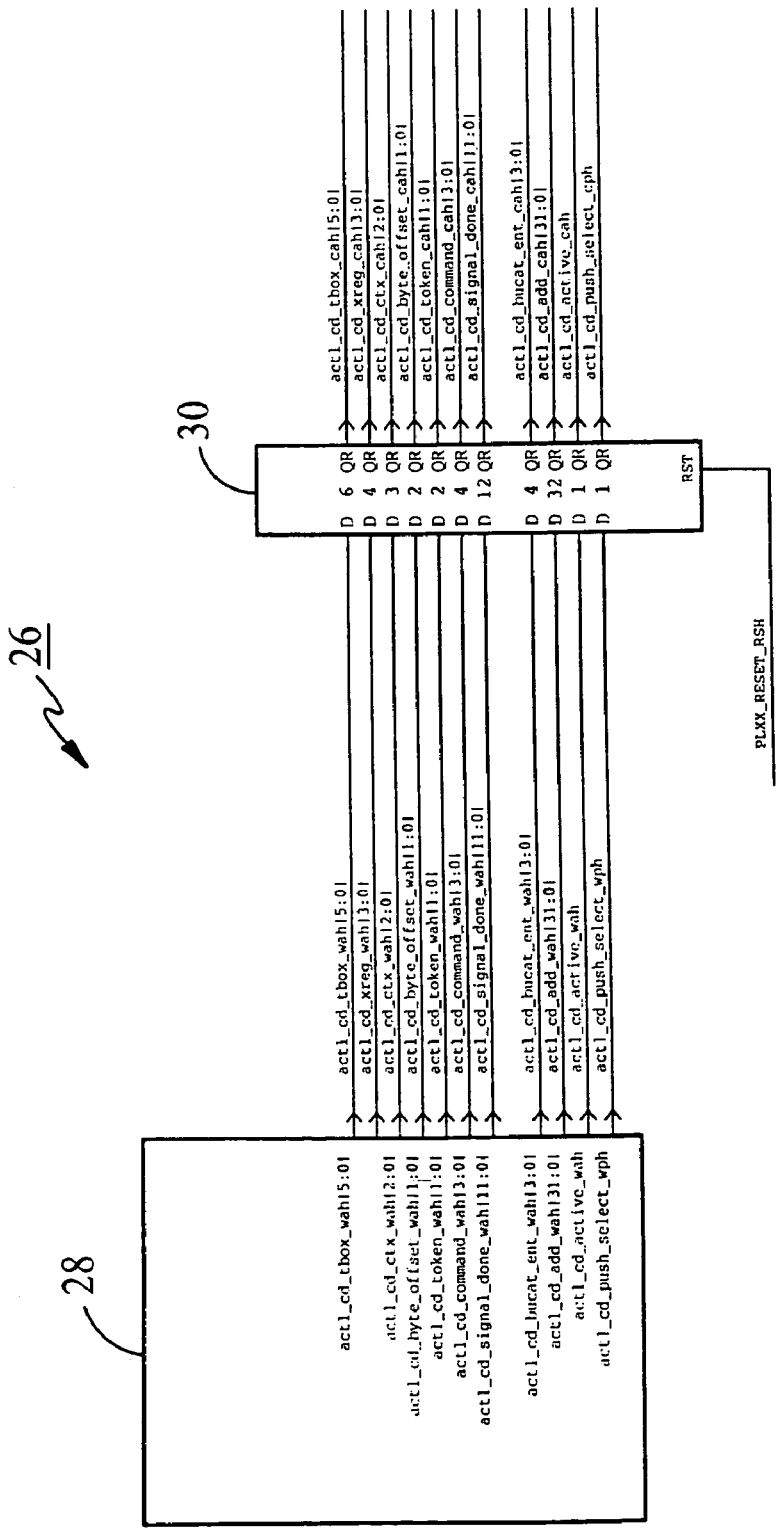
FIG. 3 is a block diagram of an alternative logic design containing state and combinatorial elements.

Referring to FIG. 3, process 10 associates (105) computer code that simulates the logic design with each of the graphic elements. For example, process 10 associates computer code with combinatorial logic element 28 to define its function and with state logic element 30 to define its function. The same is true for the logic elements of FIG. 2. The computer code is generated as follows.

Process 10 receives (106) intermediate computer code that is written by the logic designer. The computer code is "intermediate" in the sense that it is an application-specific code, from which simulation code, such as C++ or Verilog, may be generated. In one embodiment, the intermediate computer code includes a netlist that defines logic elements and the interconnections of those elements.

The intermediate code is entered by the designer for each graphic element. For example, the designer may select a graphic element and, using an interactive tool, enter computer code to define the combinatorial (or state) logic represented by that element. The designer may use software objects from the library, such as FFs, latches, AND gates, etc., in the intermediate code. Several objects may be combined within a single graphic element by writing intermediate computer code to effect the combination. For example, an array of FFs may be produced by combining objects from the library via the intermediate code. Graphic element 30 (FIG. 3) contains such an array of FFs.

When designing the logic, the logic designer is constrained by process 10 to represent combinatorial logic and state logic using separate graphic elements. Representing the design using separate state logic and combinatorial logic elements ensures that each separate logic element will achieve its desired state with one iteration, making cycle-based simulation (defined below) possible. Accordingly, process 10 performs (107) an error check to determine if the intermediate code written by the designer includes state logic in combinatorial graphic elements, or vice versa. If a state logic element contains combinatorial logic or a combinatorial logic element contains state logic, process 10 issues (108) an error message to the designer. The error message may define the problem (i.e., interleaved combinatorial and state logic) and the graphic element that contains the problem. In this embodiment, process 10 requires the designer to correct the problem before process 10 proceeds further. To correct such a problem, the logic designer places the combinatorial logic and the state logic in different graphic elements (i.e., blocks).

Assuming that there are no problems with the design, or that the problems have been corrected, process 10 generates simulation code for the design. In this embodiment, process 10 generates either Verilog computer code or C++ computer code from the intermediate computer code. However, the simulation code is not limited to generating only these two types of simulation code. Any other type of suitable code, an example of which is VHDL, may be generated.

Generally speaking, the designer may select, e.g., via a graphical user interface (GUI) (not shown), which computer code (C++ or Verilog) process 10 will generate. The type of simulation desired may dictate the computer code that process 10 will generate, as described below.

In more detail, two types of logic simulations include cycle-based simulations and event-driven simulations. An event-driven simulation converges on an output of the logic design through multiple cycles. Convergence requires several passes through "logic cones" defined by the computer code.

Figure 4:
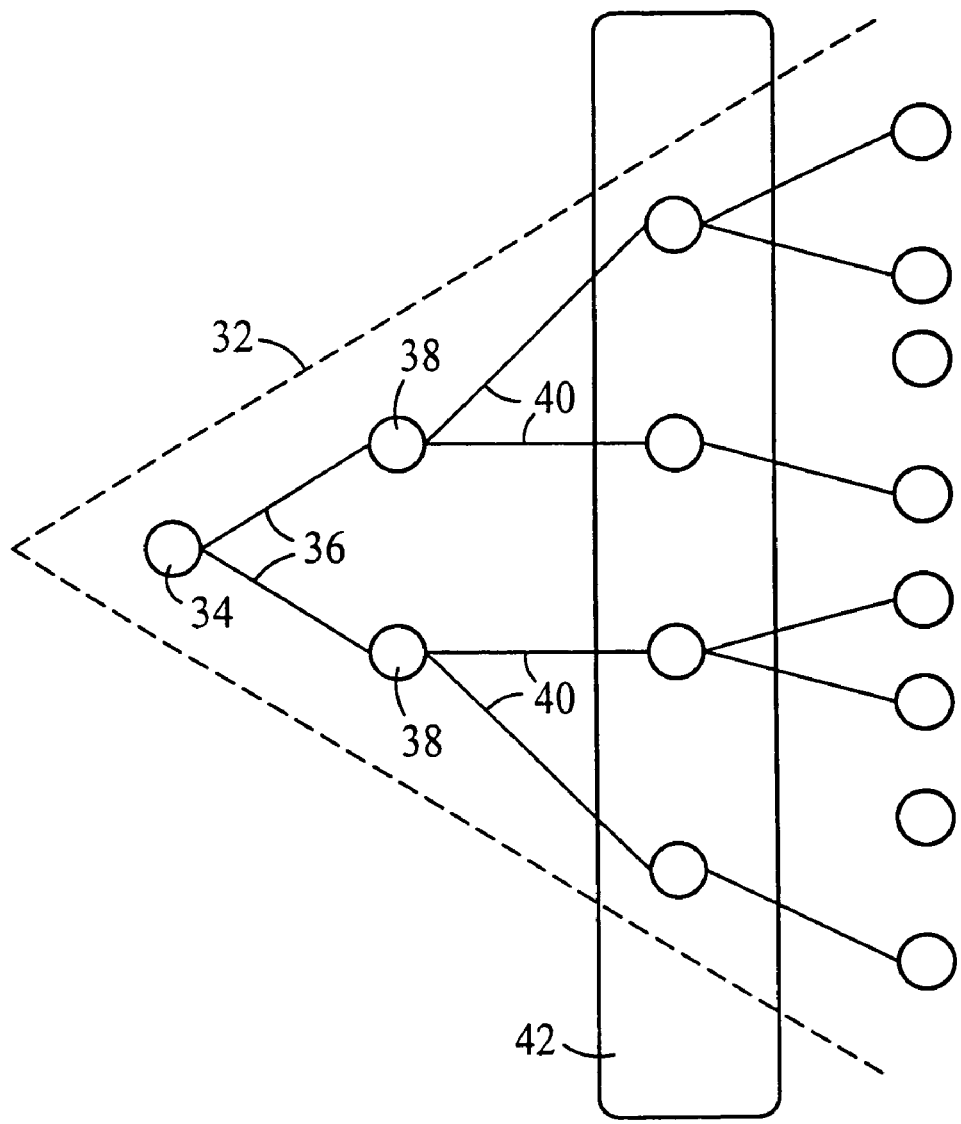
FIG. 4 shows a logic cone.

Referring to FIG. 4, a logic cone 32 is an ordered arrangement in which one logic element 34 passes its output 36 to multiple logic elements 38, which, in turn, pass their outputs 40 to other logic elements 42, and so on. Combining state and combinatorial logic elements within a single logic cone requires multiple passes (iterations) through that cone in order for the state elements to achieve the appropriate states and thus provide the proper output.

The syntax of some simulation languages, such as Verilog, is particularly amenable to event-driven simulations, since they interleave state and combinatorial logic. By contrast, C++ can be used to effect cycle-based simulations. Cycle-based simulations assume that the computer code is ordered correctly, meaning that each logic cone can be traced, with only one iteration, to provide an output. Thus, cycle-based simulations require only a single pass through a logic cone in order to determine its output.

As a result, cycle-based simulators are faster, e.g., an order of magnitude faster, than event-driven simulators (since cycle-based simulators require only one pass, versus multiple passes, through a logic cone). So, for example, on a platform, such as an Intel® Pentium® III microprocessor running at 700 MHz (megahertz), simulating 100 cycles of a complex logic design with an event-driven model might take 10 seconds, whereas performing the same simulation using a cycle-based simulator might take 1 second.

For the foregoing reasons, cycle-based simulations are generally preferred over event-driven simulations. Since separating the combinatorial logic from the state logic facilitates cycle-based simulations, process 10 provides a significant advantage to logic designers.

Referring back to FIG. 1, process 10 decides (109) whether to generate C++ simulation code or Verilog simulation code from the intermediate computer code. This decision (109) is typically made based on an input from the logic designer. If process 10 decides (109) that Verilog code is to be generated, process 10 generates (110) the Verilog code from the intermediate code. The Verilog code may be generated from the intermediate code using a translator program (not shown) and a database (not shown) that correlates the connections defined by the intermediate code to Verilog code. Parameters or values in the intermediate code are identified and input to the Verilog code.

After process 10 generates (110) the Verilog code, process 10 runs (111) the Verilog code through an event-driven simulator program. The event-driven simulator program runs, and provides inputs (e.g., clock signals), to the Verilog code to generate a simulation of the operation of the logic design. To obtain an output of the logic design using the event-driven simulation, more than one pass through each logic cone defined by the Verilog code may be required.

If process 10 decides (109) to generate C++ code from the intermediate code (based, e.g., on an input from the logic designer), process 10 generates (112*a*) a topology of each graphic element of the logic design based on the intermediate code. In more detail, process 10 traces the logic gates through the intermediate code for each graphic element in order to determine how the logic gates are connected to one another. Essentially, process 10 obtains a gate topology from the intermediate code.

Process 10 identifies (113) clock domains in the topology. In this context, a clock domain comprises a set of logic elements (gates) that are triggered in response to the same clock pulse. For example, referring to FIG. 5, logic gates 50 to 60 are all triggered in response to clock pulse 62, which is initially applied to logic gates 50, 51. The intermediate code provided by the designer indicates which clock pulses trigger which logic gates. Accordingly, process 10 traces clock pulses through the logic gates in order to identify the clock domains.

Once the clock domains are identified, process 10 determines (114*a*) the order in which the logic gates are to be simulated. This is referred to as "code ordering", since the order in which the gates are simulated dictates the order of the resulting C++ code. Process 10 performs code ordering by tracing through each clock domain separately and assigning numerical values to the logic gates.

Figure 5:
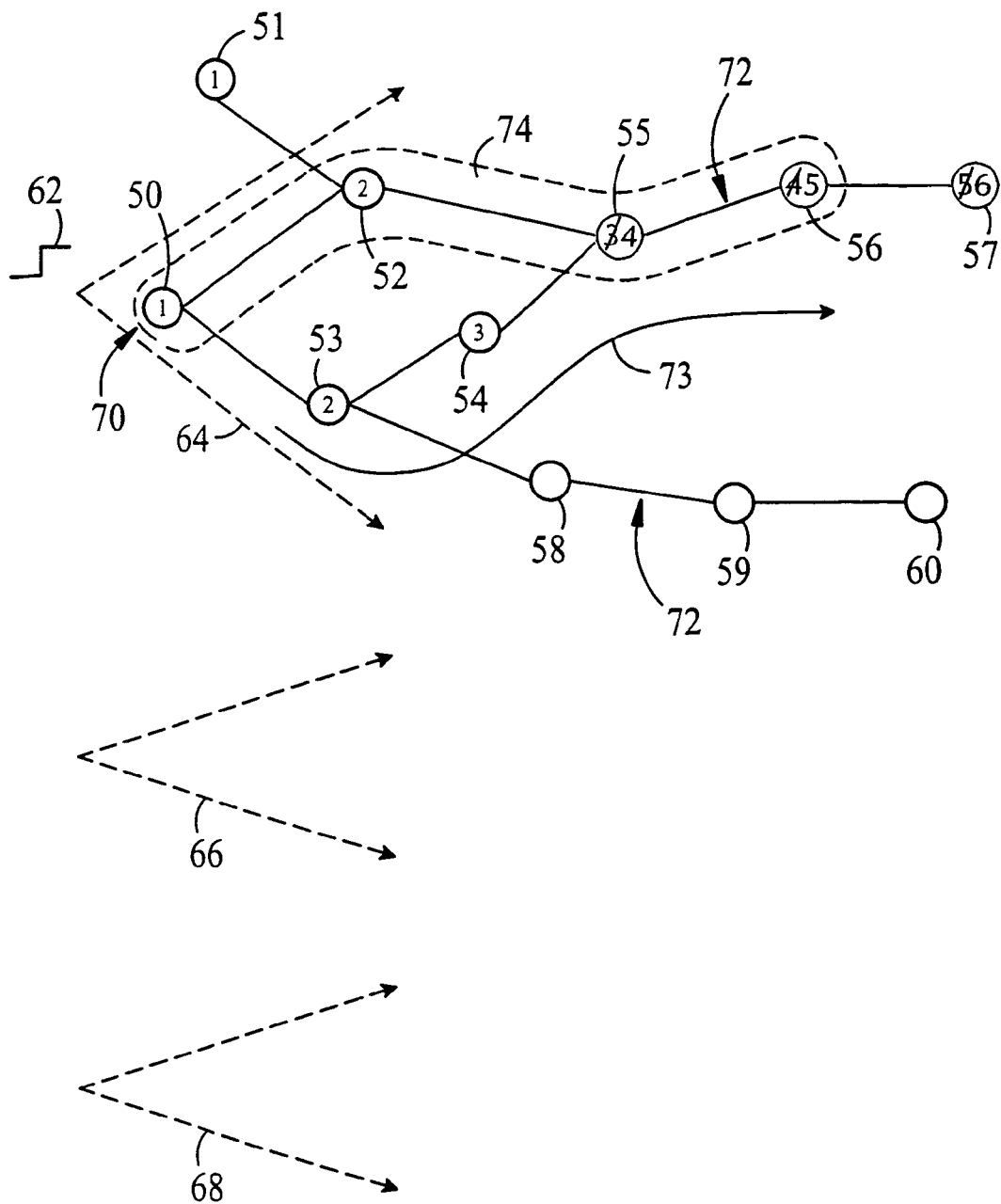
FIG. 5 shows clock domains of a logic design.

Referring to FIG. 5, each clock domain 64, 66, 68 can be thought of as a tree having a trunk 70 and branches 72. Process 10 starts at the trunk, in this case logic gate 50, and traverses the tree through to the end of each branch. So, process 10 numbers the trunk (gate 50) "1", then, for branch 74, numbers gate 52 "2", gate 55 "3", gate 56 "4", and so forth. To number another branch, process 10 starts at the trunk and then proceeds in the foregoing manner.

Occasional renumbering may be required, resulting in branches whose gates are not sequentially numbered. This does not present a problem, so long as the assigned number of a child branch is higher than the assigned number of a parent branch. By way of example, assume that there are two starting points (trunks) for clock domain 64. These two starting points are gates 50 and 51. Since both are starting points, they are both assigned number "1". Further assume that branch 72 is first traced starting with gate 51, resulting in gate 51 being assigned a "1", gate 52 being assigned a "2", gate 55 being assigned a "3", and so forth. When branch 72 is retraced starting at gate 50 through path 73, gate 55 is renumbered "4", gate 56 is renumbered "5", and so forth. This may occur as often as necessary in order to ensure that each branch is numbered correctly.

Following the numbering, process 10 examines each clock domain and extracts, from each clock domain, the logic gates numbered "1". These gates are stored in an area of a database. Once this is done, process 10 examines each clock domain and extracts, from each domain, the logic gates numbered "2". These gates are stored in another area of the database. This is repeated then, for each set of logic gates numbered "3", "4", etc., until sets of all numbered logic gates are stored in different areas of the database. Using this database, process 10 generates simulation code (in this embodiment, C++ code) for the logic gates.

In more detail, for the set of logic gates assigned number "1", process 10 generates C++ code. That is, process 10 defines the connections of the "1" gates, their states, clocks, and other dependencies in C++ code. Following the C++ code for the set of logic gates assigned number "1", process 10 generates C++ code to simulate the set of logic gates assigned number "2". Following the C++ code for the set of logic gates assigned number "2", process 10 generates C++ code to simulate the set of logic gates assigned number "3". This is repeated in sequence until C++ code is generated for all sets of logic gates (e.g., "4", "5", etc.) in the database.

The C++ simulation code may be generated from the intermediate code using a translation program (not shown) and referencing a database (not shown) that correlates the connections and functions specified in the intermediate code to C++ code. Any parameters or values included in the intermediate code are identified and applied to the C++ code.

After process 10 generates the C++ code, process 10 may run (115) the C++ code through a cycle-based simulator program (this path is indicated by the dotted line in FIG. 1). The cycle-based simulator program provides inputs to, and runs, the C++ code to provide a simulation of the operation of the logic design. To obtain an output of the logic design using the cycle-based simulation, one pass through each logic gate defined by the C++ code is made.

In some instances, a C++ compiler may be unable to compile the C++ code due to its size (i.e., the generated C++ code may be too long for a standard C++ compiler). In these instances, further processing may be required. This processing includes dividing (116) the C++ code into segments based on the numbered logic gates; writing (117) the divided C++ code into separate C++ files and batch files, and compiling the separate C++ files. Thus, in order to use a standard compiler, process 10 compiles C++ code for each set of numbered logic gates. The compiled C++ code may then be run through the cycle-based simulator program separately.

The states of each logic gate are stored in a database as well. Process 10 takes advantage of C++ inheritance capabilities to enable the C++ compiler to handle the large numbers of states that may result from a given logic model. That is, the state of an initial logic gate may be defined as a C++ class. The states of logic gates that depend from the initial logic gate may refer back to the state of the initial logic gate without actually including data for the state of the initial logic gate. This way, if the state of a subsequent gate depends on the state of a preceding gate, it is possible to obtain the state of the preceding gate without actually adding more data to the database.

Keeping the combinatorial logic and state logic separate according to process 10 makes it possible to identify clock domains and, thus, to perform cycle-based simulations. The advantages of cycle-based simulations are noted above.

Figure 6:
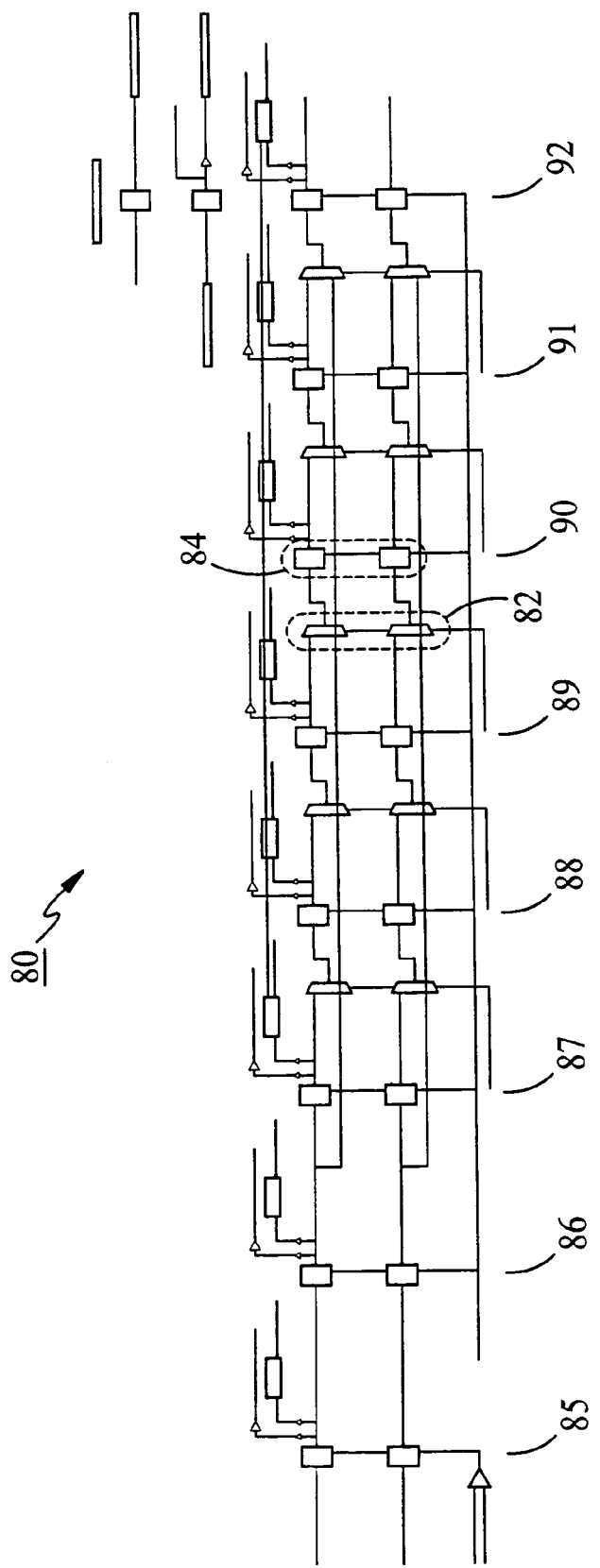
FIG. 6 is a block diagram of an alternative logic design containing state and combinatorial elements.

Another advantage to keeping combinatorial and state logic separate is that it facilitates manual review of logic designs. Representing the different logic types (e.g., state and combinatorial) in different colors further facilitates the manual review. For example, FIG. 6 shows a logic design 80 that contains both combinatorial logic elements (e.g., 82) and state logic elements (e.g., 84). Simply by looking at logic design 80, it is possible to obtain relevant design information, such as the number of pipeline stages in the design (in this case, there are eight such stages 85 to 92). Other relevant information may also be obtained.

Additionally, by explicitly calling-out state logic elements while in the design environment, it is relatively easy to develop heuristic tools for providing time/size guidance for a given set of design parameters, such as operating frequency and/or chip area.

Figure 7:
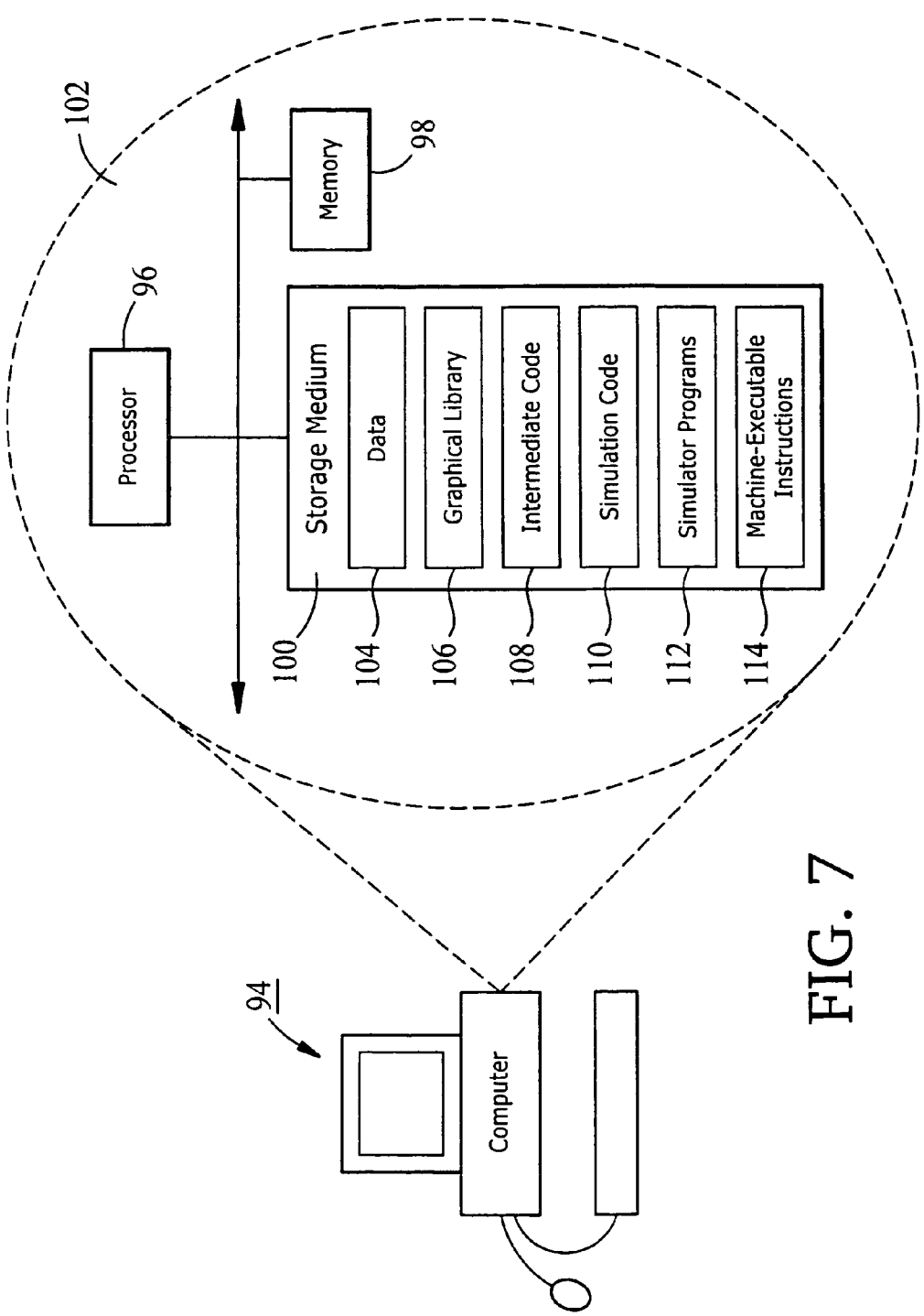
FIG. 7 is a block diagram of a computer system on which the process of FIG. 1 may be performed.

FIG. 7 shows a computer 94 for performing simulations using process 10. Computer 94 includes a processor 96, a memory 98, and a storage medium 100 (e.g., a hard disk) (see view 102). Storage medium 100 stores data 104 which defines a logic design, a graphics library 106 for implementing the logic design, intermediate code 108, simulation code 110 that represents the logic design, logic simulator programs 112 (e.g., event-driven and/or cycle-based), and machine-executable instructions 114, which are executed by processor 96 out of memory 98 to perform process 10 on data 104.

Process 10, however, is not limited to use with the hardware and software of FIG. 7; it may find applicability in any computing or processing environment. Process 10 may be implemented in hardware, software, or a combination of the two. Process 10 may be implemented in computer programs executing on programmable computers or other machines that each includes a processor, a storage medium readable by the processor (including volatile and non-volatile memory and/or storage elements), at least one input device, and one or more output devices. Program code may be applied to data entered using an input device, such as a mouse or a keyboard, to perform process 10 and to generate a simulation.

Each such program may be implemented in a high level procedural or object-oriented programming language to communicate with a computer system. However, the programs can be implemented in assembly or machine language. The language may be a compiled or an interpreted language.

Each computer program may be stored on an article of manufacture, such as a storage medium or device (e.g., CD-ROM, hard disk, or magnetic diskette), that is readable by a general or special programmable machine for configuring and operating the machine when the storage medium or device is read by the machine to perform process 10. Process 10 may also be implemented as a machine-readable storage medium, configured with a computer program, where, upon execution, instructions in the computer program cause the machine to operate in accordance with process 10.

The invention is not limited to the specific embodiments set forth above. For example, process 10 is not limited to simulating only combinatorial and state logic elements. Other logic elements may be simulated. Process 10 is not limited to the computer languages set forth above, e.g., Verilog, C++, and VHDL. It may be implemented using any appropriate computer language. Process 10 is also not limited to the order set forth in FIG. 1. That is, the blocks of process 10 may be executed in a different order than that shown to produce an acceptable result.

Other embodiments not described herein are also within the scope of the following claims.

What is claimed is:

1. A method, performed by at least one processing device, for simulating a logic design comprised of combinatorial logic and state logic, the method comprising:
   representing the combinatorial logic and the state logic using separate graphic elements;
   identifying clock domains for the combinatorial logic and the state logic using the separate graphic elements;
   generating computer code that simulates operation of portions of the logic design, the computer code being generated based on the clock domains; and
   associating the computer code with graphic elements that correspond to the portions of the logic design.

2. The method of claim 1, further comprising:
   performing an error check on the graphic elements to determine if a single graphic element represents both combinatorial logic and state logic; and
   issuing an error message if the single graphic element represents both combinatorial logic and state logic.

3. The method of claim 1, further comprising:
   generating intermediate code that simulates the portions of the logic design;

wherein the computer code is generated from the intermediate code.

4. The method of claim 1, wherein the computer code comprises C++ or Verilog.

5. The method of claim 4, wherein, if the computer code comprises C++, the method further comprises running the computer code through a cycle-based simulator to provide a simulation of an operation of the logic design.

6. The method of claim 1, further comprising:
generating a topology of the logic design based on the graphic elements;
wherein the clock domains are identified from the topology.

7. The method of claim 1 further comprising: dividing the computer code into segments; and
compiling the segments separately.

8. The method of claim 1, wherein state elements comprise elements which hold a particular logic state for a period of time and combinatorial logic elements comprise elements which combine two or more states to produce an output.

9. The method of claim 1, wherein the graphic elements comprise block diagrams.

10. An article comprising one or more machine-readable media which store executable instructions to simulate a logic design comprised of combinatorial logic and state logic, the instructions causing a machine to:
represent the combinatorial logic and the state logic using separate graphic elements;
identify clock domains for the combinatorial logic and the state logic using the separate graphic elements;
generate computer code that simulates operation of portions of the logic design, the computer code being generated based on the clock domains; and
associate the computer code with graphic elements that correspond to the portions of the logic design.

11. The article of claim 10, further comprising instructions that cause the machine to:
perform an error check on the graphic elements to determine if a single graphic element represents both combinatorial logic and state logic; and
issue an error message if the single graphic element represents both combinatorial logic and state logic.

12. The article of claim 10, further comprising instructions that cause the machine to:
generate intermediate code that simulates the portions of the logic design;
wherein the computer code is generated from the intermediate code.

13. The article of claim 10, wherein the computer code comprises C++ or Verilog.

14. The article of claim 13, wherein, if the computer code comprises C++, the article further comprises instructions that cause the machine to run the computer code through a cycle-based simulator to provide a simulation of an operation of the logic design.

15. The article of claim 10, further comprising instructions that cause the machine to:
generate a topology of the logic design based on the graphic elements;
where the clock domains are identified from the topology.

16. The article of claim 10, further comprising instructions that cause the machine to:
divide the computer code into segments; and
compile the segments separately.

17. The article of claim 10, wherein state elements comprise elements which hold a particular logic state for a period of time and combinatorial logic elements comprise elements which combine two or more states to produce an output.

18. The article of claim 10, wherein the graphic elements comprise block diagrams.

19. An apparatus for simulating a logic design comprised of combinatorial logic and state logic, the apparatus comprising:
memory that stores executable instructions; and
a processor that executes the instructions to:
represent the combinatorial logic and the state logic using separate graphic elements;
identifying clock domains for the combinatorial logic and the state logic using the separate graphic elements;
generating computer code that simulates operation of portions of the logic design, the computer code being generated based on the clock domains; and
associate the computer code with graphic elements that correspond to the portions of the logic design.

20. The apparatus of claim 19, wherein the processor executes the instructions to:
perform an error check on the graphic elements to determine if a single graphic element represents both combinatorial logic and state logic; and
issue an error message if the single graphic element represents both combinatorial logic and state logic.

21. The apparatus of claim 19, wherein the processor executes the instructions to:
generate intermediate code that simulates the portions of the logic design;
wherein the computer code is generated from the intermediate code.

22. The apparatus of claim 19, wherein the computer code comprises C++ and or Verilog.

23. The apparatus of claim 22, wherein, if the computer code comprises C++, the apparatus further comprises executes instructions that cause the machine to run the computer code through a cycle-based simulator to provide a simulation of an operation of the logic design.

24. The apparatus of claim 19, wherein the processor executes the instructions to:
generate a topology of the logic design based on the graphic elements;
wherein the clock domains are identified from the topology.

25. The apparatus of claim 19, wherein the processor executes the instructions to:
divide the computer code into segments; and
compile the segments separately.

26. The apparatus of claim 19, wherein state elements comprise elements which hold a particular logic state for a period of time and combinatorial logic elements comprise elements which combine two or more states to produce an output.

27. The apparatus of claim 19, wherein the graphic elements comprise block diagrams.

* * * * *